United States Patent
Zhang et al.

(10) Patent No.: US 10,224,378 B2
(45) Date of Patent: Mar. 5, 2019

(54) ORGANIC LIGHT EMITTING DEVICE (OLED) PIXEL ARRANGEMENT STRUCTURE

(71) Applicant: TRULY (HUIZHOU) SMART DISPLAY LIMITED, Huizhou, Guangdong (CN)

(72) Inventors: Xuefeng Zhang, Guangdong (CN); Jianbing Ou, Guangdong (CN); Jiajia Xu, Guangdong (CN); Xianjun Ke, Guangdong (CN); Junhai Su, Guangdong (CN); Jianhua Li, Guangdong (CN)

(73) Assignee: TRULY (HUIZHOU) SMART DISPLAY LIMITED, Huizhou, Guangdong (CN)

( * ) Notice: Subject to any disclaimer, the term of this patent is extended or adjusted under 35 U.S.C. 154(b) by 0 days.

(21) Appl. No.: 15/544,852

(22) PCT Filed: Jul. 29, 2015

(86) PCT No.: PCT/CN2015/085430
§ 371 (c)(1),
(2) Date: Jul. 19, 2017

(87) PCT Pub. No.: WO2016/115862
PCT Pub. Date: Jul. 28, 2016

(65) Prior Publication Data
US 2018/0019287 A1  Jan. 18, 2018

(30) Foreign Application Priority Data
Jan. 21, 2015 (CN) .......................... 2015 1 0030229

(51) Int. Cl.
*H01L 27/32* (2006.01)
*H01L 51/00* (2006.01)

(52) U.S. Cl.
CPC ...... *H01L 27/3218* (2013.01); *H01L 51/0011* (2013.01)

(58) Field of Classification Search
None
See application file for complete search history.

(56) References Cited

U.S. PATENT DOCUMENTS

| | | |
|---|---|---|
| 9,240,436 B2 | 1/2016 | Shen et al. |
| 2008/0001525 A1 | 1/2008 | Chao et al. |

(Continued)

FOREIGN PATENT DOCUMENTS

| | | |
|---|---|---|
| CN | 101051648 A | 10/2007 |
| CN | 101752407 A | 6/2010 |

(Continued)

OTHER PUBLICATIONS

International Search Report for PCT/CN2015/085430, dated Aug. 26, 2015, ISA/CN.

(Continued)

*Primary Examiner* — Michelle Mandala
(74) *Attorney, Agent, or Firm* — U.S. Fairsky LLP; Yue (Robert) Xu

(57) ABSTRACT

An organic light emitting diode pixel arrangement structure includes multiple first sub-pixels, multiple second sub-pixels, and multiple third sub-pixels. Two adjacent first sub-pixels are arranged in a first sub-pixel group, two adjacent second sub-pixels are arranged in a second sub-pixel group, two adjacent third sub-pixels are arranged in a third sub-pixel group. The multiple sub-pixels form multiple arrays, and each array includes at least one first sub-pixel, at least one second sub-pixel and at least one third sub-pixel, each of the first, second and third sub-pixel groups corresponds to a square opening of a mask plate in an evaporation process, there is an inclination angle between a side of the (Continued)

square opening and an arrangement direction of a linear evaporation source, and the inclination angle is an acute angle or an obtuse angle.

7 Claims, 5 Drawing Sheets

(56) References Cited

U.S. PATENT DOCUMENTS

2014/0292622 A1    10/2014  Lee
2016/0253943 A1*   9/2016   Wang .................. G09G 3/2003
                                                                 345/694

FOREIGN PATENT DOCUMENTS

CN        103985735 A      8/2014
CN        104617126 A      5/2015

OTHER PUBLICATIONS

The Chinese 1st Office Action for CN201510030229.4, dated Jan. 3, 2017.

* cited by examiner

ORGANIC LIGHT EMITTING DEVICE (OLED) PIXEL ARRANGEMENT STRUCTURE

This application is a National Stage application of PCT international patent application PCT/CN2015/085430, filed on Jul. 29, 2015 which claims priority to Chinese Patent Application No. 201510030229.4, titled "ORGANIC LIGHT EMITTING DEVICE (OLED) PIXEL ARRANGEMENT STRUCTURE", filed with the Chinese Patent Office on Jan. 21, 2015, both of which are incorporated herein by reference in their entireties.

FIELD

The present disclosure relates to the technical field of semiconductor display device, and in particular to an organic light emitting diode pixel arrangement structure.

BACKGROUND

Organic light emitting diodes (OLED) have become the third generation display technology following liquid crystal displays, because of display characteristics, such as active light emission, a large visibility angle, a wide color gamut, a short response time and a high contrast, and advantages, such as a light weight, a thin thickness and flexibility.

In the conventional technology, an organic light emitting diode pixel arrangement structure usually includes multiple pixels. Each pixel includes a red (R) sub-pixel, a green (G) sub-pixel and a blue (B) sub-pixel, and R, G, B sub-pixels are arranged repeatedly to form an array. R, G, and B sub-pixels are square, and a long side and a short side of the square are perpendicular or parallel to a horizontal line (the horizontal line is parallel to a transverse direction of a paper intuitively, a linear evaporation source is arranged along the horizontal line in an evaporation process, and a scanning direction in the evaporation process is perpendicular to the linear evaporation source).

A conventional organic light emitting diode pixel structure is greatly influenced by a shadow effect. In the evaporation process, since the linear evaporation source is arranged along the horizontal line, the scanning direction is perpendicular to the horizontal line, the evaporation source has an evaporation angle, and there is a gap between a mask plate and a glass substrate. In such a structure, the sub-pixel obtained by evaporating with the mask plate having an opening usually has a shadow with respect to the opening on the mask plate. The larger the shadow is, the larger a distance between the openings of the mask plate is, and thus an area of a metal between the openings is increased, and an aperture ratio (a ratio of a light-emitting area of a pixel to a total area of the pixel) is reduced. Therefore, the distance between the openings on the mask plate is increased, while a pixel resolution (PPI, Pixels Per Inch) is reduced.

SUMMARY

In view of the above, it is essential to provide an organic light emitting diode pixel arrangement structure for decreasing influence of a shadow effect.

The organic light emitting diode pixel arrangement structure includes multiple first sub-pixels, multiple second sub-pixels and multiple third sub-pixels. Two adjacent first sub-pixels are arranged in a first sub-pixel group, two adjacent second sub-pixels are arranged in a second sub-pixel group, and two adjacent third sub-pixels are arranged in a third sub-pixel group. The multiple first sub-pixels, the multiple second sub-pixels and the multiple third sub-pixels form multiple arrays, and each of the multiple arrays includes at least one first sub-pixel, at least one second sub-pixel and at least one third sub-pixel. Each of the first sub-pixel group, the second sub-pixel group and the third sub-pixel group corresponds to a square opening of a mask plate in an evaporation process. There is an inclination angle between a side of the square opening and an arrangement direction of a linear evaporation source, and the inclination angle is an acute angle or an obtuse angle.

Since the inclination angle exists in the above organic light emitting diode pixel arrangement structure, influence of a shadow effect can be decreased in evaporation, which is beneficial to manufacture an organic light-emitting display with a high aperture ratio and a high resolution.

BRIEF DESCRIPTION OF THE DRAWINGS

To illustrate technical solutions according to embodiments of the present disclosure or in the conventional technologies more clearly, drawings to be used in the descriptions of the embodiments or the conventional technologies are described briefly hereinafter. Apparently, the drawings described hereinafter are only for some embodiments of the present disclosure, and other drawings may be obtained by those skilled in the art based on those drawings without creative efforts.

DETAILED DESCRIPTION

To ease the understanding of the present disclosure, the present disclosure will be fully described hereinafter with reference to accompanying drawings. The drawings illustrate preferred embodiments. The present disclosure can be embodied in many different forms and is not limited to the embodiments described herein. The purpose of providing these embodiments is to make the content disclosed by the present disclosure be understood more thoroughly and comprehensively.

It should be noted that, when an element is referred to as "being arranged on" another element, the element may be directly located on another element, or there may be an element between them. When an element is referred to as "being connected to" another element, the element may be directly connected to another element, or there may be an element between them. Terms "vertical", "horizontal", "left", "right" and similar expressions used herein are only for illustrative purposes, but do not represent a unique embodiment.

Unless otherwise defined, all technical and scientific terms used herein have the same meaning as commonly understood by those skilled in the art, to which the present disclosure belongs. The terms used in the specification of the present disclosure are only for the purpose of describing specific embodiments, but not intended to limit the disclosure. The term "and/or" includes any and all combinations of one or more related listed items.

Figure 1:
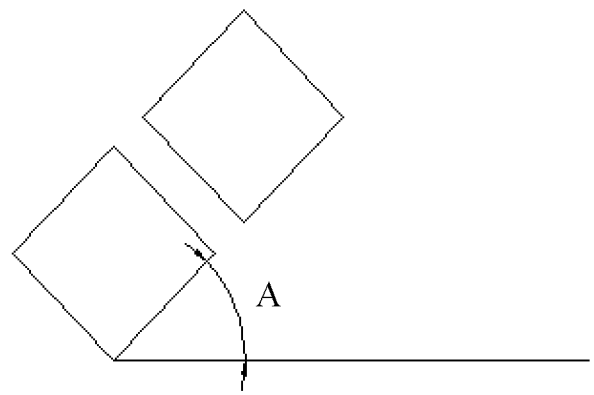
FIG. 1 is a schematic diagram of a part of an organic light emitting diode pixel arrangement structure according to an embodiment.

Reference is made to FIG. 1, which is a schematic diagram of a part of an organic light emitting diode pixel arrangement structure according to an embodiment.

The organic light emitting diode pixel arrangement structure includes multiple first sub-pixels, multiple second sub-pixels and multiple third sub-pixels. Two adjacent first sub-pixels are arranged in a first sub-pixel group, two adjacent second sub-pixels are arranged in a second sub-pixel group, and two adjacent third sub-pixels are arranged in a third sub-pixel group (one sub-pixel group is shown in FIG. 1). The multiple first sub-pixels, the multiple second sub-pixels and the multiple third sub-pixels form multiple arrays, and each of the multiple arrays includes at least one first sub-pixel, at least one second sub-pixel and at least one third sub-pixel. Each of the first sub-pixel group, the second sub-pixel group and the third sub-pixel group corresponds to a square opening of a mask plate in an evaporation process. There is an inclination angle between a side of the square opening and an arrangement direction of a linear evaporation source. It can also be understood that an inclination angle A is formed between an arrangement direction of sub-pixels in one sub-pixel group and the arrangement direction of the linear evaporation source. The inclination angle is an acute angle or an obtuse angle, that is, the inclination angle is not 0°, 90°, or 180°. In the embodiment, the linear evaporation source is arranged in a horizontal direction in an evaporation process.

Figure 2:
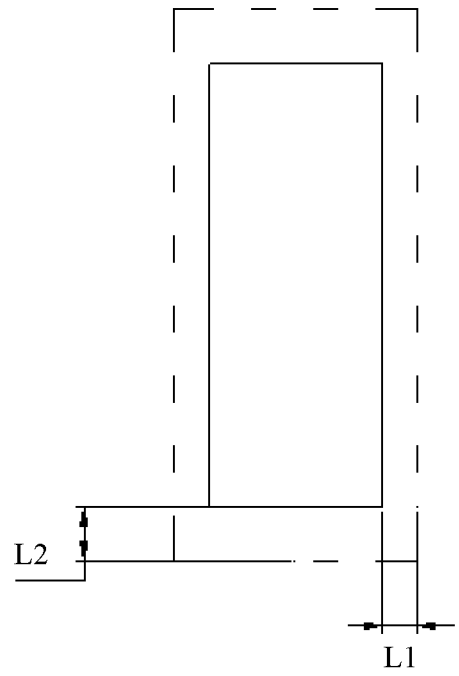
FIG. 2 is a schematic diagram of a shadow effect generated by an organic light emitting diode pixel arrangement structure.
Figure 3:
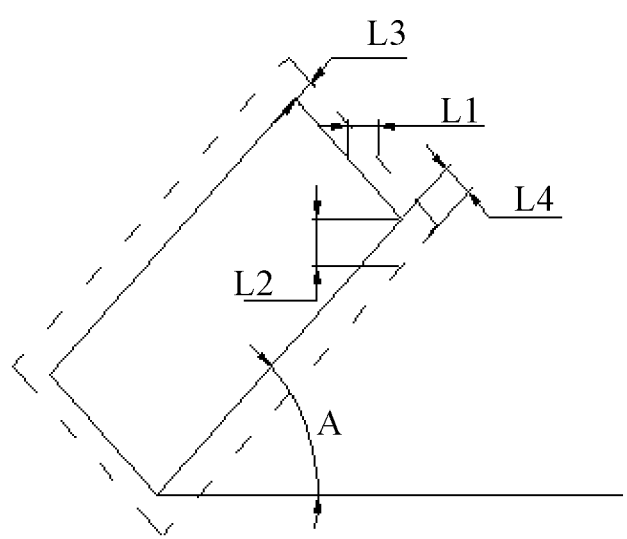
FIG. 3 is a schematic diagram of principles of an organic light emitting diode pixel arrangement structure decreasing a shadow effect according to an embodiment.

Reference is made to FIG. 2 and FIG. 3, FIG. 2 is a schematic diagram of a shadow effect generated by an organic light emitting diode pixel arrangement structure, and FIG. 3 is a schematic diagram of principles of an organic light emitting diode pixel arrangement structure as shown in FIG. 1 decreasing a shadow effect.

As shown in FIG. 2, a solid line represents an opening on a mask plate corresponding to a sub-pixel, and a dotted line represents a size of a shadow. It is assumed that a width of the shadow in the vertical direction is L1, and a width of the shadow in the horizontal direction is L2.

As shown in FIG. 3, the inclination angle between one side of the square opening and a horizontal line is A. That is, an inclination angle between one side of the square opening and the arrangement direction of the linear evaporation source is A, and 0<A<90° is taken for an example (similar to 90°<A<180°). Since the arrangement direction of the linear evaporation source is defined to be a horizontal direction (a transverse direction on the paper), and a scanning direction in the evaporation process is perpendicular to the horizontal line, lengths of the shadow in the vertical direction and in the horizontal direction may be considered not to be changed, and are still L1 and L2. Therefore, the lengths of an actual shadow of the sub-pixel as shown in FIG. 3 are L3=L1×sin A, L4=L2×sin A, and both become smaller, which is beneficial to manufacture a display with a high aperture ratio and a high resolution.

Figure 4:
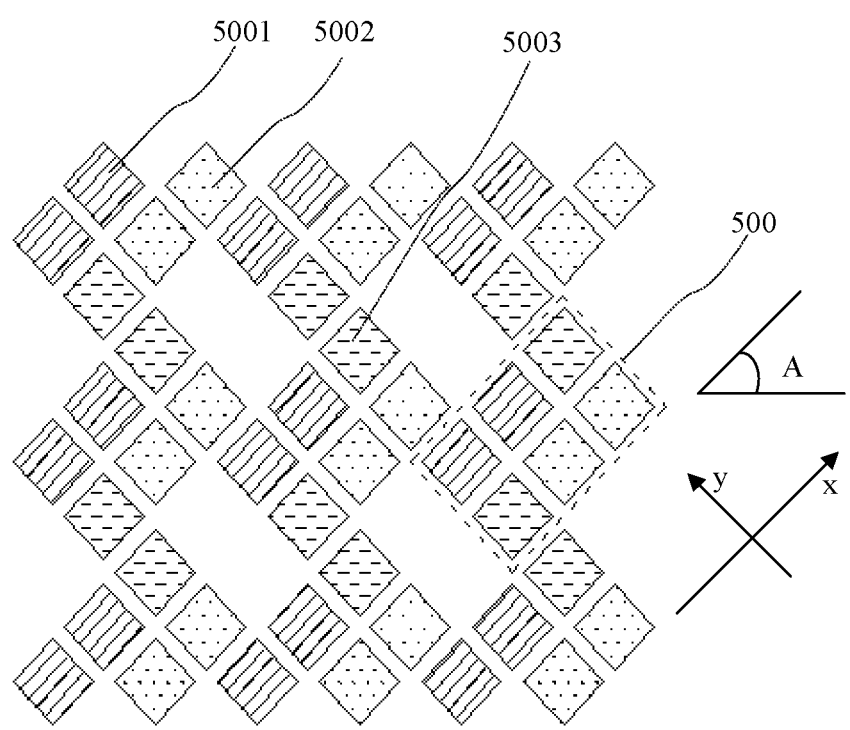
FIG. 4 is a schematic diagram of a part of an organic light emitting diode pixel arrangement structure according to an embodiment.

Reference is made to FIG. 4, which is a schematic diagram of a part of an organic light emitting diode pixel arrangement structure according to an embodiment.

There is an inclination angle A between an arrangement direction of two first sub-pixels 5001 in the first sub-pixel group and the arrangement direction of the linear evaporation source, that is, the horizontal line. There is an inclination angle A between an arrangement direction of two second sub-pixels 5002 in the second sub-pixel group and the arrangement direction of the linear evaporation source, that is, the horizontal line. There is an inclination angle (180°−A) between an arrangement direction of two third sub-pixels 5003 in the third sub-pixel group and the arrangement direction of the linear evaporation source, that is, the horizontal line. A is an acute angle or an obtuse angle, that is, 0<A<90°, or 90°<A<180°.

Each arrays includes one first sub-pixel group, one second sub-pixel group and two third sub-pixels arranged separately. Two first sub-pixels in the first sub-pixel group are located on the same straight line as one of the two third sub-pixels, and two second sub-pixels in the second sub-pixel group are located on the same straight line as the other one of the two third sub-pixels.

In the embodiment, an x-axis and a y-axis are established along arrangement directions of the arrays including the sub-pixels, and a minimum repeating unit for the array is a basic arrangement structure 500 with two rows and three columns. The basic arrangement structure 500 includes, in the first row, the first sub-pixel 5001, the first sub-pixel 5001, and the third sub-pixel 5003 arranged in order along the x-axis. The basic arrangement structure 500 includes, in the second row, the third sub-pixel 5003, the second sub-pixel 5002, and the second sub-pixel 5002 arranged in order along the x-axis. In the y-axis direction, a distance between the first row of sub-pixels in one basic arrangement structure and the first row of sub-pixels in the basic arrangement structure adjacent to the one basic arrangement structure equals to one sub-pixel. In the x-axis direction, the first column of sub-pixels of one basic arrangement structure is arranged in the same column as the third column of the basic arrangement structure adjacent to the one basic arrangement structure.

Figure 5:
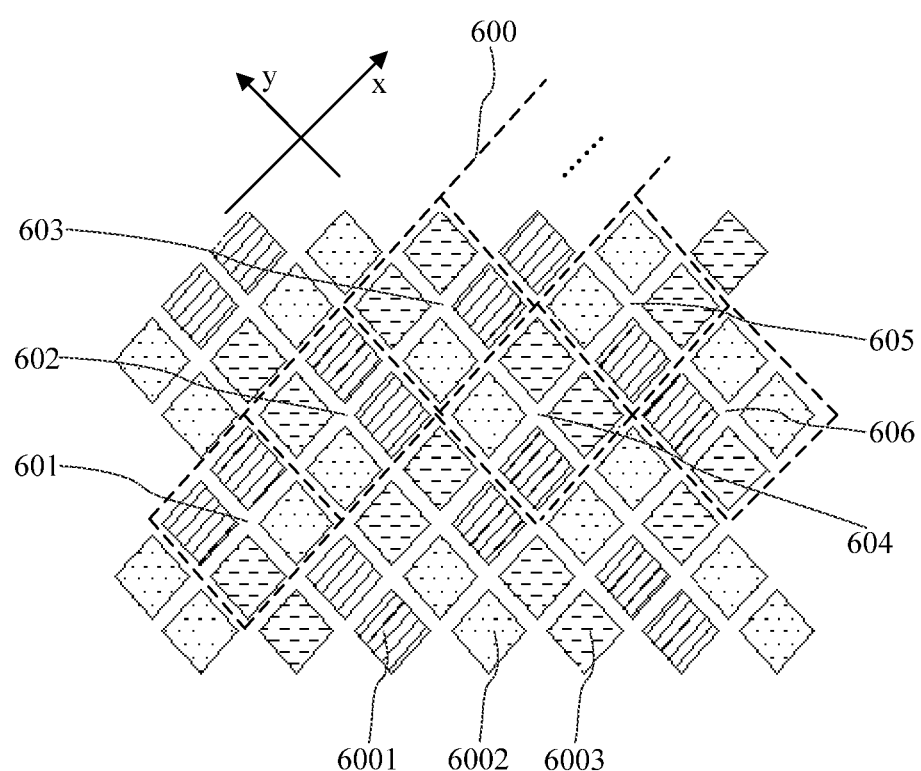
FIG. 5 is a schematic diagram of a part of an organic light emitting diode pixel arrangement structure according to an embodiment.

Reference is made to FIG. 5, which is a schematic diagram of a part of an organic light emitting diode pixel arrangement structure according to an embodiment.

Each array includes one sub-pixel group and two sub-pixels, and the array at least includes one first sub-pixel 6001, one second sub-pixel 6002, and one third sub-pixel 6003. It can also be understood that the array includes one first sub-pixel group, and one second sub-pixel 6002 and one third sub-pixel 6003 which are adjacent to two first sub-pixels 6001 in the first sub-pixel group, or the array includes one second sub-pixel group, and one first sub-pixel 6001 and one third sub-pixel 6003 which are adjacent to two second sub-pixels 6002 in the second sub-pixel group, or the array includes one third sub-pixel group, and one first sub-pixel 6001 and one second sub-pixel 6002 which are adjacent to two third sub-pixels 6003 in the third sub-pixel group.

In two adjacent arrays including the first sub-pixel groups arranged in the same straight line, there is an inclination angle A between an arrangement direction of the first sub-pixels 6001 in the first sub-pixel group of one of the two adjacent arrays and the arrangement direction of the linear evaporation source, that is, the horizontal line, there is an inclination angle (180°−A) between an arrangement direction of the first sub-pixels 6001 in the first sub-pixel group of the other one of the two adjacent arrays and the arrangement direction of the linear evaporation source, that is, the horizontal line. In two adjacent arrays including the second sub-pixel groups arranged in the same straight line, there is an inclination angle A between an arrangement direction of the second sub-pixels 6002 in the second sub-pixel group of one of the two adjacent arrays and the arrangement direction of the linear evaporation source, that is, the horizontal line, there is an inclination angle (180°–A) between an arrangement direction of the second sub-pixels 6002 in the second sub-pixel group of the other one of the two adjacent arrays and the arrangement direction of the linear evaporation source, that is, the horizontal line. In two adjacent arrays including the third sub-pixel groups arranged in the same straight line, there is an inclination angle A between an arrangement direction of the third sub-pixels 6003 in the third sub-pixel group of one of the two adjacent arrays and the arrangement direction of the linear evaporation source that is, the horizontal line, there is an inclination angle (180°–A) between an arrangement direction of the third sub-pixels 6003 in the third sub-pixel group of the other one of the two adjacent arrays and the arrangement direction of the linear evaporation source that is, the horizontal line. A is an acute angle or an obtuse angle, that is, 0<A<90°, or 90°<A<180°.

In the embodiment, an x-axis and a y-axis are established along arrangement directions of the arrays including the sub-pixels, and a minimum repeating unit for the array includes first to sixth basic structures with two rows and two columns arranged along the x-axis (601 to 603 are three basic structures in a first minimum repeating unit, 604 and 605 are the basic structures in a second minimum repeating unit, and 606 is the basic structure in a third minimum repeating unit, not all basic structures are drawn due to a limited size of the paper). The basic structures are described in order of rows and columns. The first basic structure 601 includes the first sub-pixel 6001, the first sub-pixel 6001, the third sub-pixel 6003, and the second sub-pixel 6002 in order of rows and columns. The second basic structure 602 includes the third sub-pixel 6003, the first sub-pixel 6001, the second sub-pixel 6002, and the first sub-pixel 6001. The third basic structure 603 includes the third sub-pixel 6003, the third sub-pixel 6003, the second sub-pixel 6002, and the first sub-pixel 6001. The fourth basic structure 604 includes the second sub-pixel 6002, the third sub-pixel 6003, the first sub-pixel 6001, and the third sub-pixel 6003. The fifth basic structure 605 includes the second sub-pixel 6002, the second sub-pixel 6002, the first sub-pixel 6001, and the third sub-pixel 6003. The sixth basic structure 606 includes the first sub-pixel 6001, the second sub-pixel 6002, the third sub-pixel 6003, and the second sub-pixel 6002. In the x-axis direction, the minimum repeating units are arranged repeatedly in sequence, and in the y-axis direction, adjacent two minimum repeating units are staggered for one basic structure.

Figure 6:
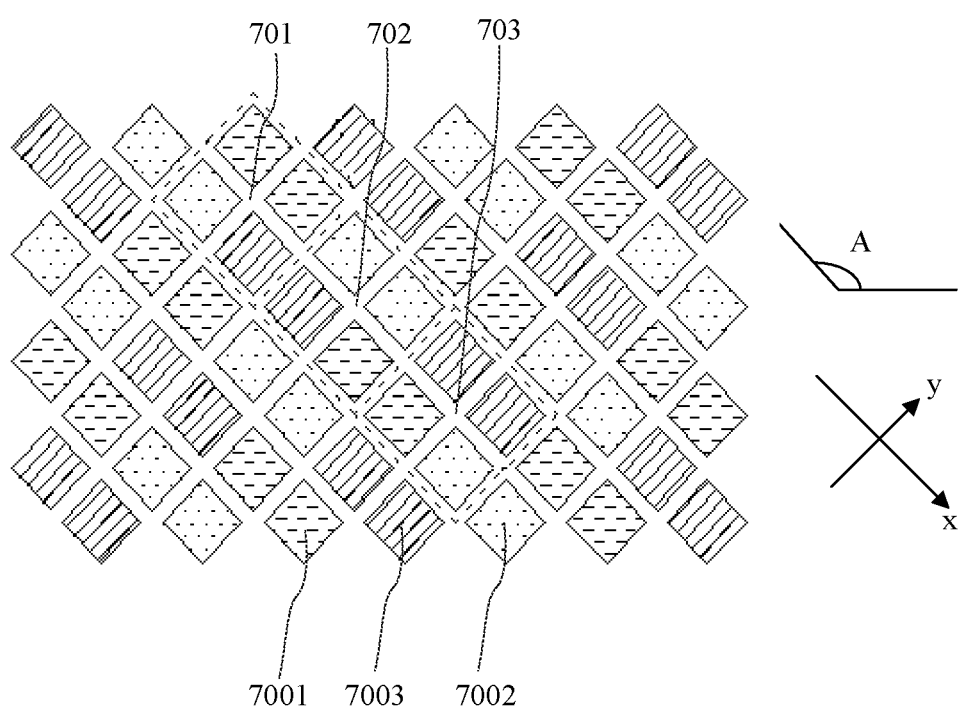
FIG. 6 is a schematic diagram of a part of an organic light emitting diode pixel arrangement structure according to an embodiment.

Reference is made to FIG. 6, which is a schematic diagram of a part of an organic light emitting diode pixel arrangement structure according to an embodiment.

There is an inclination angle A between each of arrangement directions of two first sub-pixels 7001 in the first sub-pixel group, two second sub-pixels 7002 in the second sub-pixel group and two third sub-pixels 7003 in the third sub-pixel group and the arrangement direction of the linear evaporation source, that is, the horizontal line. A is an acute angle or an obtuse angle, that is, 0<A<90°, or 90°<A<180°.

In the embodiment, the x-axis and the y-axis are established along arrangement directions of the arrays including sub-pixels, and the minimum repeating unit for the array includes first to third basic structures with two rows and two columns arranged along the x-axis. The basic structures are described in order of rows and columns. The first basic structure 701 includes the first sub-pixel 7001, the first sub-pixel 7001, the second sub-pixel 7002, and the third sub-pixel 7003. The second basic structure 702 includes the second sub-pixel 7002, the second sub-pixel 7002, the third sub-pixel 7003, and the first sub-pixel 7001. The third basic structure 703 includes the third sub-pixel 7003, the third sub-pixel 7003, the first sub-pixel 7001, and the second sub-pixel 7002. In the x-axis direction, the minimum repeating units are arranged repeatedly in sequence, and in the y-axis direction, minimum repeating units in one column are the same.

In each of the above embodiments, the first sub-pixel, the second sub-pixel, and the third sub-pixel are configured with different light-emitting colors from each other, which are red, green and blue. A pixel defining layer (PDL layer) is filled between the first sub-pixel, the second sub-pixel and the third sub-pixel, and the pixel defining layer is made of polyamide or acrylic.

In the organic light emitting diode pixel arrangement structure according to the above embodiments, the first sub-pixel, the second sub-pixel, and the third sub-pixel are rectangular in shape, arranged in an array in the direction of both sides of the rectangle, and there is an inclination angle between one side of the rectangle and the horizontal line, and the influence of the shadowing effect can be reduced in evaporation due to the presence of the inclination angle, thereby facilitating the manufacture of an organic light emitting display having a high aperture ratio and a high resolution.

Various technical features in the above embodiments can be arbitrarily combined, and not all possible combinations of the various technical features in the above embodiments are described to make description simple. All combinations of these technical features without contradiction should be considered to fall within the scope of the specification.

The above embodiments are only some embodiments of the disclosure, and the above embodiments are described in detail, and the above embodiments should not be considered to limit the scope of the present disclosure. It should be noted that various modifications and improvements can be made by those skilled in the art without departing from the concept of the disclosure, and the modifications and improvements fall within the protection scope of the present disclosure. Accordingly, the protection scope of the present disclosure should be determined by the appended claims.

The invention claimed is:

1. An organic light emitting diode pixel arrangement structure comprising:
   a plurality of first sub-pixels, wherein two adjacent first sub-pixels are arranged in a first sub-pixel group;
   a plurality of second sub-pixels, wherein two adjacent second sub-pixels are arranged in a second sub-pixel group; and
   a plurality of third sub-pixels, wherein two adjacent third sub-pixels are arranged in a third sub-pixel group,
   wherein the plurality of first sub-pixels, the plurality of second sub-pixels and the plurality of third sub-pixels form a plurality of arrays, each of the first sub-pixel group, the second sub-pixel group and the third sub-pixel group corresponds to a square opening of a mask plate in an evaporation process,
   wherein there is an inclination angle A between an arrangement direction of two first sub-pixels in the first sub-pixel group and the arrangement direction of the linear evaporation source, there is an inclination angle A between an arrangement direction of two second sub-pixels in the second sub-pixel group and the arrangement direction of the linear evaporation source, there is an inclination angle (180°-A) between an arrangement direction of two third sub-pixels in the third sub-pixel group and the arrangement direction of the linear evaporation source, and A is an acute angle or an obtuse angle, wherein each of the arrays comprises one first sub-pixel group, one second sub-pixel group and two third sub-pixels arranged separately, two first sub-pixels in the first sub-pixel group are located on the same straight line as one of the two third sub-pixels, and two second sub-pixels in the second sub-pixel group are located on the same straight line as the other one of the two third sub-pixels.

2. An organic light emitting diode pixel arrangement structure comprising:

a plurality of first sub-pixels, wherein two adjacent first sub-pixels are arranged in a first sub-pixel group;

a plurality of second sub-pixels, wherein two adjacent second sub-pixels are arranged in a second sub-pixel group; and a plurality of third sub-pixels, wherein two adjacent third sub-pixels are arranged in a third sub-pixel group, wherein the plurality of first sub-pixels, the plurality of second sub-pixels and the plurality of third sub-pixels form a plurality of arrays, each of the first sub-pixel group, the second sub-pixel group and the third sub-pixel group corresponds to a square opening of a mask plate in an evaporation process, each of the arrays comprises one first sub-pixel group, and one second sub-pixel and one third sub-pixel which are adjacent to two first sub-pixels in the first sub-pixel group, or each of the arrays comprises one second sub-pixel group, and one first sub-pixel and one third sub-pixel which are adjacent to two second sub-pixels in the second sub-pixel group, or each of the arrays comprises one third sub-pixel group, and one first sub-pixel and one second sub-pixel which are adjacent to two third sub-pixels in the third sub-pixel group, in two adjacent arrays comprising the first sub-pixel groups arranged in the same straight line, there is an inclination angle A between an arrangement direction of the first sub-pixels in the first sub-pixel group of one of the two adjacent arrays and the arrangement direction of the linear evaporation source, there is an inclination angle (180°-A) between an arrangement direction of the first sub-pixels in the first sub-pixel group of the other one of the two adjacent arrays and the arrangement direction of the linear evaporation source; in two adjacent arrays comprising the second sub-pixel groups arranged in the same straight line, there is an inclination angle A between an arrangement direction of the second sub-pixels in the second sub-pixel group of one of the two adjacent arrays and the arrangement direction of the linear evaporation source, there is an inclination angle (180°-A) between an arrangement direction of the second sub-pixels in the second sub-pixel group of the other one of the two adjacent arrays and the arrangement direction of the linear evaporation source; in two adjacent arrays comprising the third sub-pixel groups arranged in the same straight line, there is an inclination angle A between an arrangement direction of the third sub-pixels in the third sub-pixel group of one of the two adjacent arrays and the arrangement direction of the linear evaporation source, there is an inclination angle (180°-A) between an arrangement direction of the third sub-pixels in the third sub-pixel group of the other one of the two adjacent arrays and the arrangement direction of the linear evaporation source, and A is an acute angle or an obtuse angle.

3. An organic light emitting diode pixel arrangement structure comprising:

a plurality of first sub-pixels, wherein two adjacent first sub-pixels are arranged in a first sub-pixel group;

a plurality of second sub-pixels, wherein two adjacent second sub-pixels are arranged in a second sub-pixel group; and a plurality of third sub-pixels, wherein two adjacent third sub-pixels are arranged in a third sub-pixel group, wherein the plurality of first sub-pixels, the plurality of second sub-pixels and the plurality of third sub-pixels form a plurality of arrays, each of the first sub-pixel group, the second sub-pixel group and the third sub-pixel group corresponds to a square opening of a mask plate in an evaporation process, there is an inclination angle A between each of arrangement directions of two first sub-pixels in the first sub-pixel group, two second sub-pixels in the second sub-pixel group and two third sub-pixels in the third sub-pixel group and the arrangement direction of the linear evaporation source, and A is an acute angle or an obtuse angle.

4. The organic light emitting diode pixel arrangement structure according to claim 1, wherein the first sub-pixel, the second sub-pixel and the third sub-pixel are configured with different light-emitting colors from each other, which are red, green and blue.

5. The organic light emitting diode pixel arrangement structure according to claim 1, wherein a pixel defining layer is filled between the first sub-pixel, the second sub-pixel and the third sub-pixel, and the pixel defining layer is made of polyamide or acrylic.

6. The organic light emitting diode pixel arrangement structure according to claim 2, wherein the first sub-pixel, the second sub-pixel and the third sub-pixel are configured with different light-emitting colors from each other, which are red, green and blue.

7. The organic light emitting diode pixel arrangement structure according to claim 3, wherein the first sub-pixel, the second sub-pixel and the third sub-pixel are configured with different light-emitting colors from each other, which are red, green and blue.

* * * * *